United States Patent [19]

Kaplinsky

[11] Patent Number: 5,012,135
[45] Date of Patent: Apr. 30, 1991

[54] LOGIC GATES WITH A PROGRAMMABLE NUMBER OF INPUTS

[75] Inventor: Cecil H. Kaplinsky, Palo Alto, Calif.
[73] Assignee: Plus Logic, Inc., Santa Clara, Calif.
[21] Appl. No.: 351,437
[22] Filed: May 12, 1989
[51] Int. Cl.$^5$ .................................... H03K 19/094
[52] U.S. Cl. ......................... 307/465; 307/202.1; 307/448; 307/451; 307/469; 307/471
[58] Field of Search ................ 307/202.1, 448, 451, 307/465, 471, 468–469

[56] References Cited

U.S. PATENT DOCUMENTS

| | | | |
|---|---|---|---|
| 4,157,480 | 6/1979 | Edwards | 307/471 |
| 4,233,524 | 11/1980 | Burdick | 307/471 X |
| 4,495,427 | 1/1985 | Cartwright, Jr. | 307/450 X |
| 4,558,236 | 12/1985 | Burrows | 307/465 |
| 4,600,846 | 7/1986 | Burrows | 307/465 |
| 4,642,487 | 2/1987 | Carter | 307/468 X |
| 4,761,570 | 8/1988 | Williams | 307/465 |

OTHER PUBLICATIONS

Brickman et al., "Programmable Logic Array Logic Enhancement", *IBM T.D.B.*, vol. 19, No. 2, Jul. 1976, p. 583.
Robinson, Byte Magazine, Jan. 1987, pp. 197–203.
Coli, Byte Magazine, Jan. 1987, pp. 207–219.
Electronics Magazine, Sep. 17, 1987, pp. 65–72.
Ikawa, IEEE Journal of Solid–State Physics, vol. sc–21, Apr. 1986, pp. 223–227.

*Primary Examiner*—David Hudspeth

[57] ABSTRACT

Apparatus for programming an OR gate, an AND gate or an EXCLUSIVE-OR gate to accept or not accept an input signal at an input terminal of the gate. The apparatus includes two pass transistors, a source of high or low voltage depending on the gate to be programmed, and a control signal that is used for programming the gates of the pass transistors. The two pass transistors may be of the same channel type i.e., both n-channel or both p-channel, or they may be of opposite channel types. This apparatus provides positive input signals from a group of input signals to avoid voltage signal ambiguities in programming the gates. Use of these programmable gates in combination in an AND-OR array is illustrated.

27 Claims, 6 Drawing Sheets

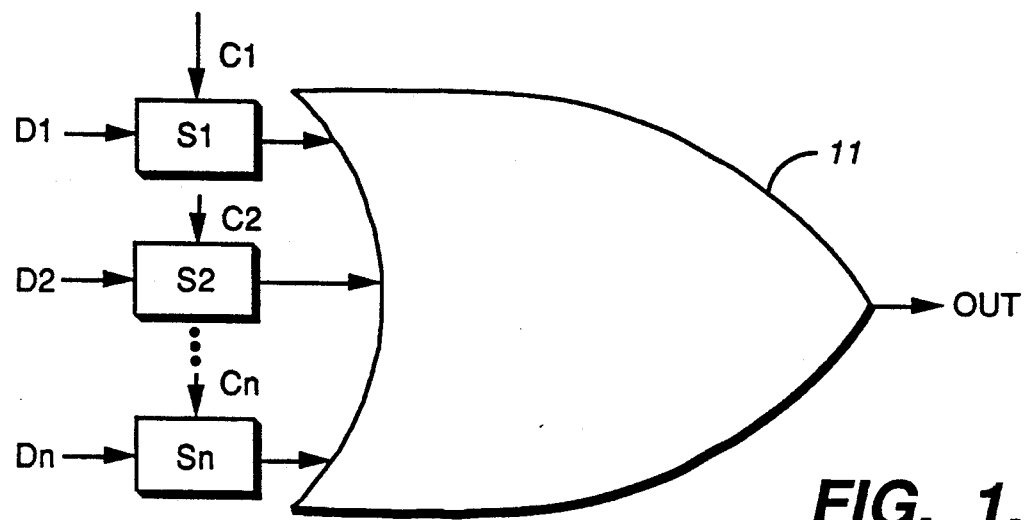
FIG._1.
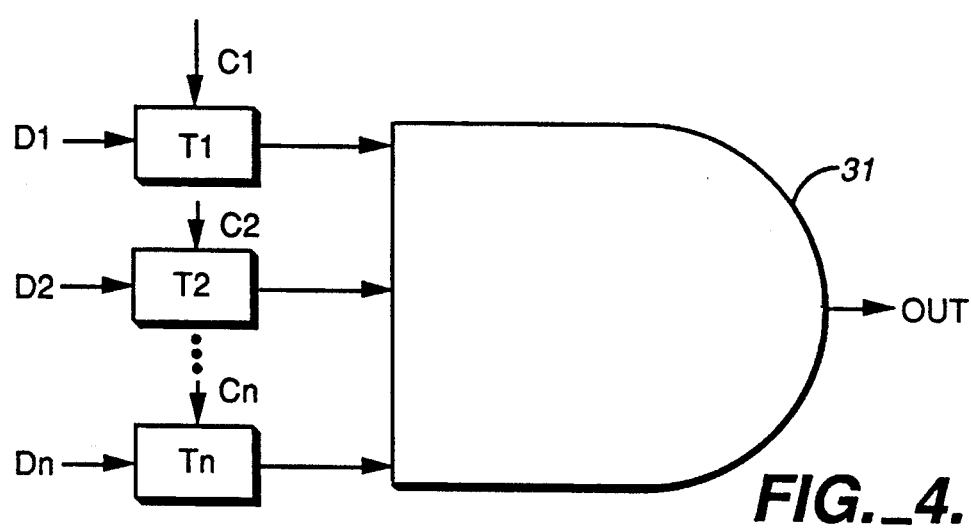
FIG._4.
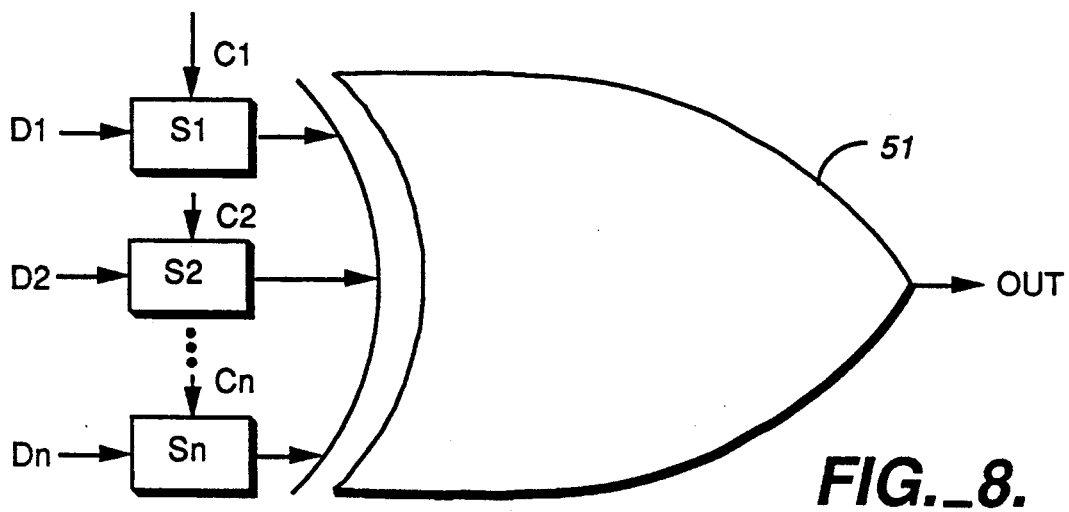
FIG._8.

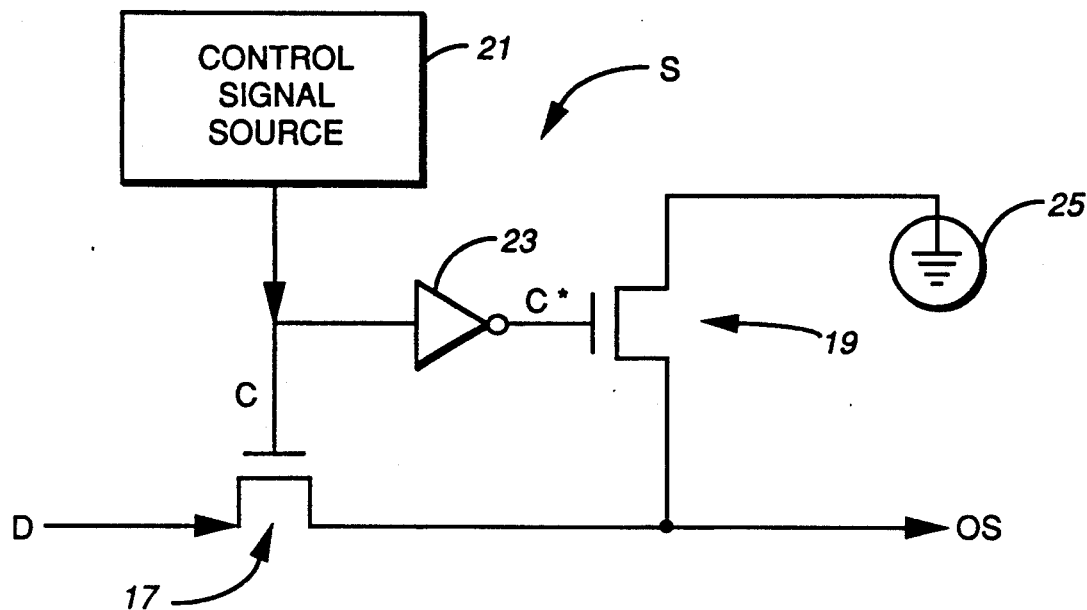
FIG._2.
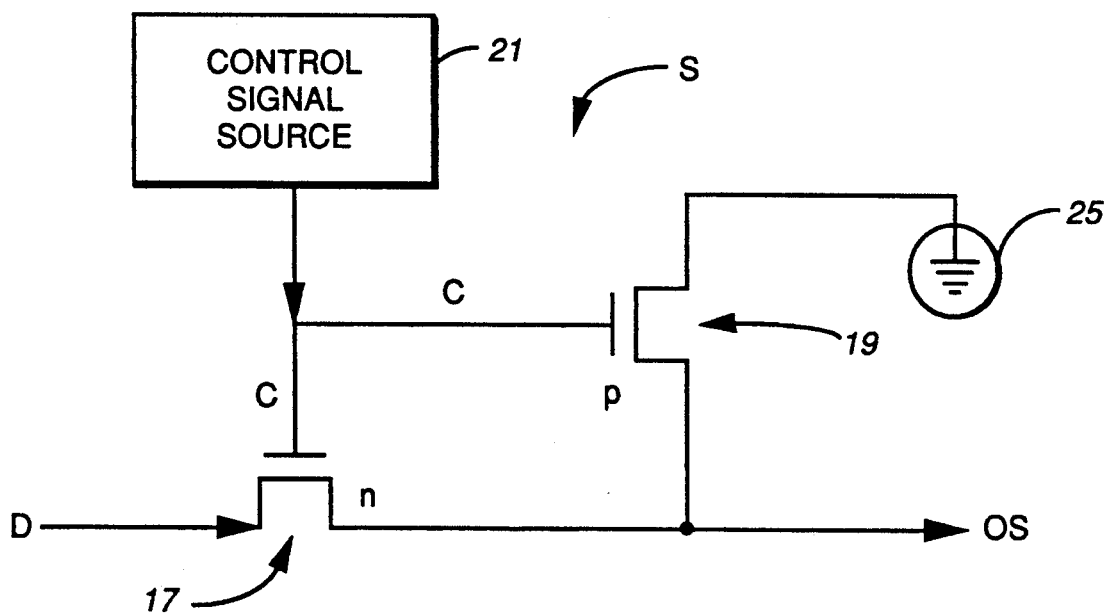
FIG._3.

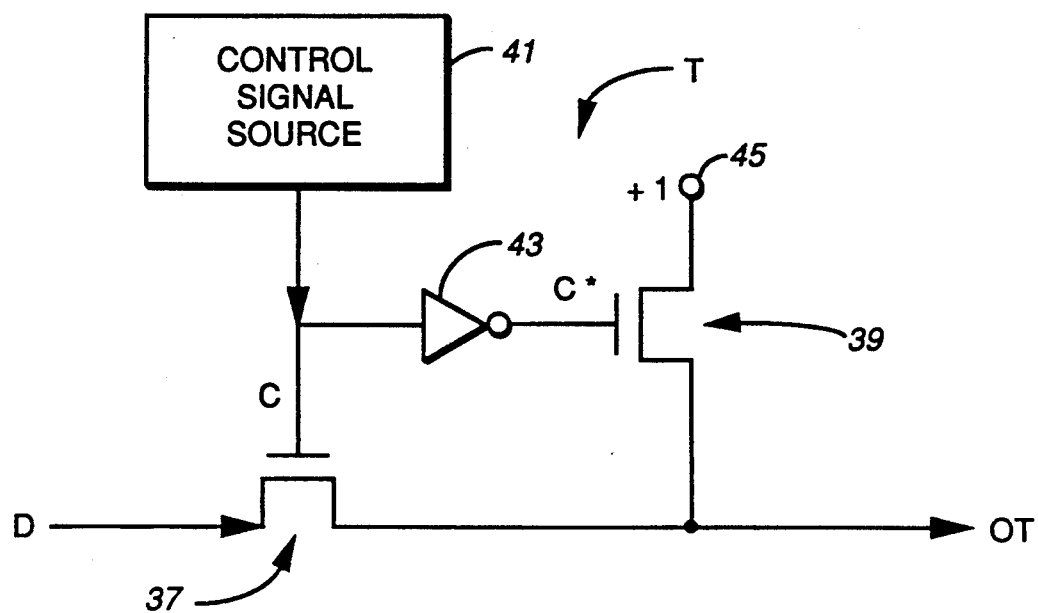
FIG._5.
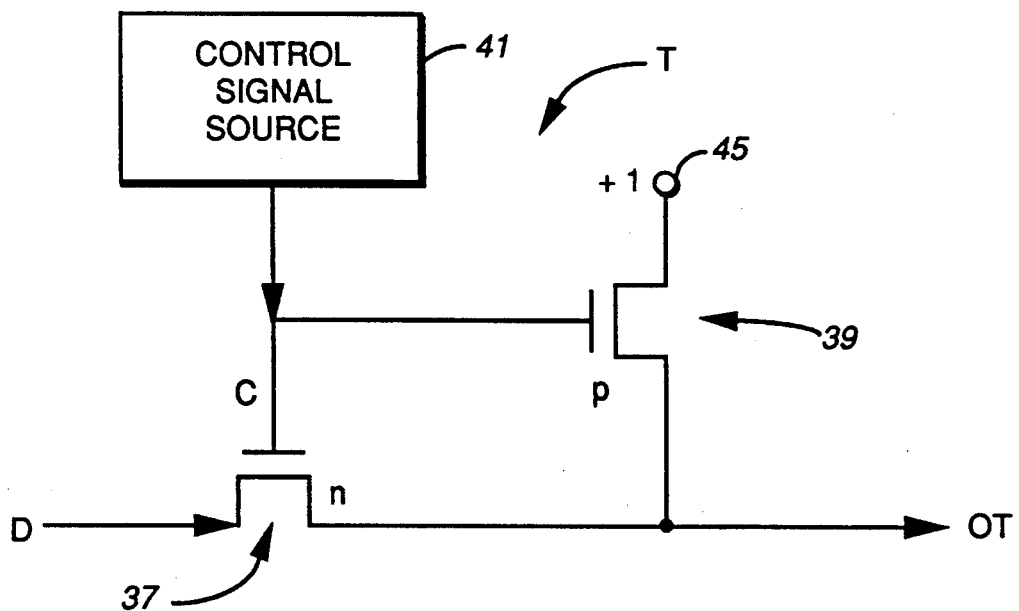
FIG._6.

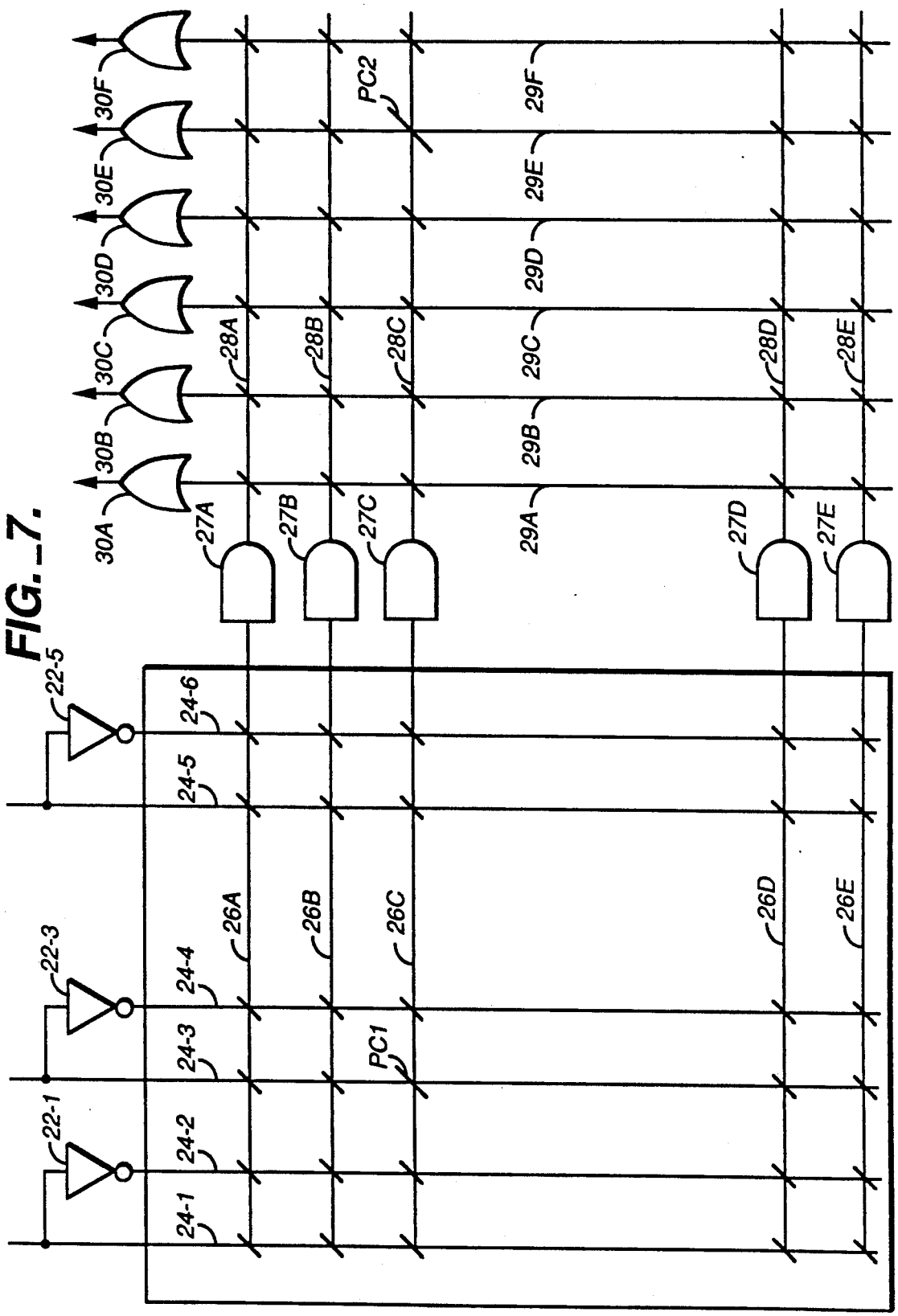
FIG._7.

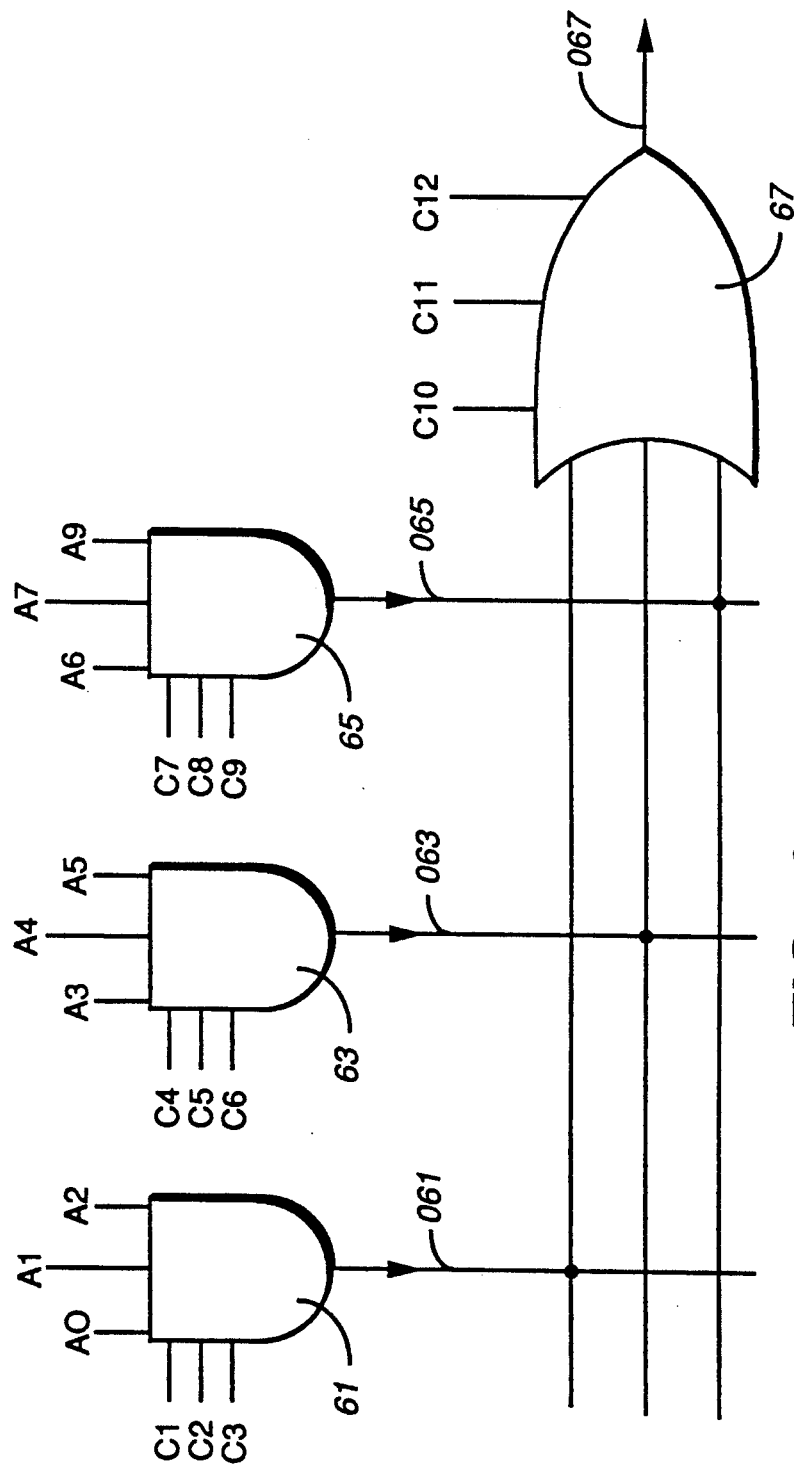
FIG._9.

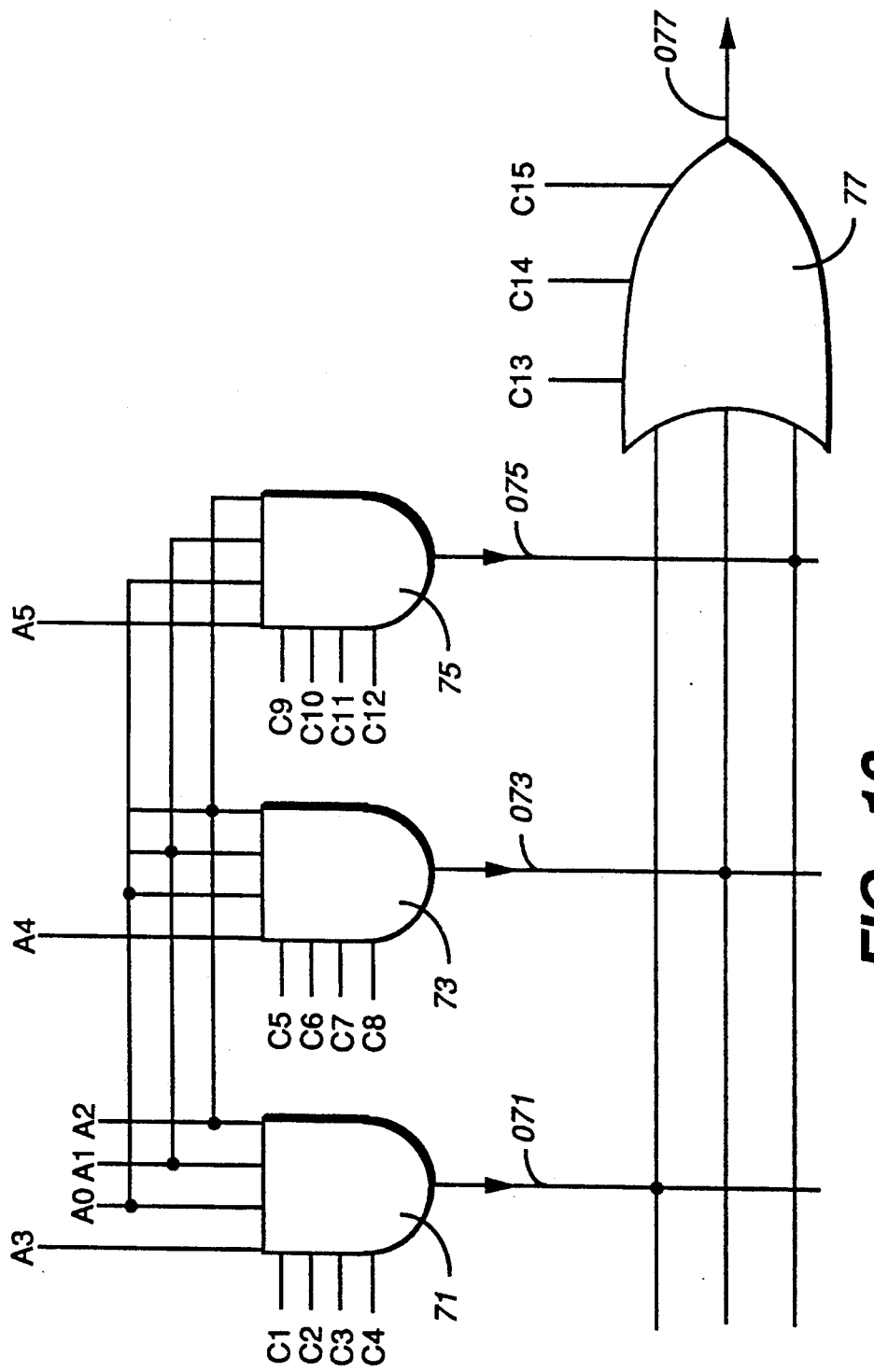
FIG._10.

LOGIC GATES WITH A PROGRAMMABLE NUMBER OF INPUTS

DESCRIPTION

1. Technical Field

This invention relates to programmable logic devices and to means for programming individual OR gates, AND gates and EXCLUSIVE-OR gates in such devices.

2. Background Art

Programmable logic devices ("PLDs") are integrated circuits that may be used to provide logical commands and logical functions in electronic systems. A PLD will typically include a set of input pins, and an array of AND logic gates followed by an array of OR logic gates, optional further signal processing means and a set of output pins. Presently, several basic types of PLD architectures are available. In a programmable logic element, ("PLE"), the AND gate array is fixed and non-programmable and the OR gate array is programmable. In a programmable array logic device ("PAL"), the AND gate array is programmable and the OR gate array is fixed. In a programmable logic array ("PLA"), both the AND gate array and the OR gate array are programmable. In any of these PLD types, at least one of an OR gate or an AND gate is programmable by external control signals or internally generated control signals.

One object of this invention is to provide simple, fast-acting means to program an OR gate or an AND gate or an EXCLUSIVE-OR gate to selectively accept signals from a group of input signals so that no voltage ambiguities arise in operation of such means.

SUMMARY OF THE INVENTION

This object is met by the invention, which provides, in one embodiment, switching apparatus that is connected to an input terminal of an OR gate or other summation means and that receives a data input signal and a control signal. If the control signal is in a first state, the switch apparatus passes the data input signal to the input terminal of the OR gate; if the control signal is in a second state that is the logical complement of the first state, the switching apparatus passes a logical zero signal to the input terminal of the OR gate. The switching apparatus for the OR gate in one embodiment may include two pass transistors with their output terminals connected together, with the pass terminal of the first pass transistor receiving the control signal and the pass terminal of the second pass transistor receiving the logical complement of the control signal. In another version, the two pass terminals receive the same control signal. The input terminal of the first pass transistor receives the data input signal, and the input terminal of the second pass transistor receives a logical zero signal.

A second embodiment of the invention provides switching apparatus that is connected to an input terminal of an AND gate or other signal multiplication means and that receives a data input signal and a control signal. If the control signal is in a first state, the switching apparatus passes the data input signal to the input terminal of the AND gate; if the control signal is in a second state that is the logical complement of the first state, the switching means passes a logical one signal to the input terminal of the AND gate. In one version, the switching apparatus for the AND gate may include two pass transistors with their output terminals connected together. The pass terminal of the first pass transistor receives the control signal, and the pass terminal of the second pass transistor receives the logical complement of the control signal. In another version, the two pass terminals receive the same control signal. The input terminal of the first pass transistor receives the data input signal, and the input terminal of the second pass transistor is connected to a logical one signal.

A third embodiment of the invention provides switching apparatus that is connected to an input terminal of an exclusive-or ("XOR") gate and that receives a data input signal and a control signal. If the control signal is in a first state, the switching apparatus passes the data input signal to the input terminal of the XOR gate; if the control signal is in a second state that is the logical complement of the first state, the switching means passes a logical zero signal to the input terminal of the XOR gate. The switching apparatus used for the OR gate discussed above may be used as the switching apparatus for the XOR gate.

BRIEF DESCRIPTION OF THE DRAWINGS

FIG. 1 is a schematic view illustrating use of an embodiment of the switch invention to produce a programmable OR gate.

FIG. 2 is a schematic view of one embodiment of the switch invention used in FIG. 1, using two pass transistors of the same channel type.

FIG. 3 is a schematic view of a second embodiment of the switch invention used in FIG. 1, using two pass transistors of opposite channel types.

FIG. 4 is a schematic view illustrating use of an embodiment of the switch invention to produce a programmable AND gate.

FIG. 5 is a schematic view of use of one embodiment of the switch invention used in FIG. 4, using two pass transistors of the same channel type.

FIG. 6 is a schematic view of a second embodiment of the switch invention used in FIG. 4, using two pass transistors of opposite channel types.

FIG. 7 is a schematic view of a programmable logic device in which the invention will be useful.

FIG. 8 is a schematic view illustrating use of an embodiment of the switch invention to produce a programmable EXCLUSIVE-OR gate.

FIGS. 9 and 10 are schematic views illustrating use of an array of switchable AND gates and OR gates in a PLD array.

BEST MODE FOR CARRYING OUT THE INVENTION

With reference to FIG. 1, a first embodiment of the invention provides a plurality of programmable switches S1, S2, ..., Sn, with switch Sk (k=1, 2, ... n) receiving a data input signal Dk at an input terminal thereof, receiving a control input signal Ck at a control terminal thereof, and issuing at an output terminal of the switch a switch output signal that is directly delivered to input terminal number k of an n-input OR gate or other signal summation means 11. If the control signal Ck is in a first predetermined logical state, for example Ck=1, the switch Sk passes the data input signal Dk to the associated input terminal of the OR gate 11. If the control signal Ck is in a second logical state that is the logical complement of the first state, the data input signal Dk is blocked and a logical zero is delivered to the input terminal number k of the OR gate 11. As shown in FIG. 1, a plurality of n such switches are provided for an n-input OR gate or other signal summation means 11, with each control signal C1, C2, ..., Cn being independently programmable.

FIG. 2 illustrates one embodiment of a switch S that may be used to program the input signals to an OR gate. Each of the embodiments discussed herein uses pass transistors for simplicity and to reduce the time delay associated with transistor operation. A pass transistor, as used herein, has an input terminal to receive a first signal, a pass terminal to receive a second signal and an output terminal that may or may not issue the first signal as its output signal. If the pass transistor is an n-channel transistor, the pass transistor will pass the first signal to the output terminal only if the second signal received at the pass terminal has a relatively high voltage, corresponding to a logical one signal. If the second signal received at the pass terminal has a relatively low voltage, corresponding to a logical zero signal, the pass transistor will not pass the first signal received at the input signal; and in the absence of other arrangements, the output signal appearing at the output terminal of the pass transistor will "float." If the pass transistor is a p-channel transistor, provision of a relatively low voltage signal at the pass terminal will allow the input signal to pass from the input terminal to the output terminal thereof; and provision of a relatively high voltage signal at the pass terminal will cause the pass transistor to block passage of the input signal.

A first pass transistor 17 and a second pass transistor 19 are connected at their output terminals in FIG. 2, which are connected to an input terminal of the OR gate. The pass terminal of the first pass transistor 17 receives a control signal C from a control signal source 21. This control signal is inverted by an inverter 23, and the inverted signal C* is delivered to the pass terminal of the second pass transistor 19. The input terminal of the first pass transistor 17 receives a data input signal D, and the input terminal of the second pass transistor is tied to a relatively low voltage source 25 that delivers a logical zero voltage signal thereat. In the embodiment of FIG. 2, it is assumed that the two pass transistors 17 and 19 have the same channel type; that is, both are n-channel type or both are p-channel type. If the control signal C that is delivered to the pass terminal of pass transistor 17 is in a predetermined first state, for example, a relatively high voltage state corresponding to a logical one signal, this pass terminal or gate will be enabled and pass transistor 17 will pass the input signal D from its input terminal to its output terminal in a well known manner. The control signal C* that is delivered to the pass terminal of pass transistor 19 will disable or turn off pass transistor 19 and block the passage of the logical zero signal from the source 25 to the output terminal of pass transistor 19. In this instance the switch S shown in FIG. 2 will produce the signal D at its output terminal, which is the common output terminal of the two pass transistors 17 and 19. If the control signal C is in a second predetermined state, for example, a relatively low voltage state corresponding to a logical zero signal, the pass terminal of pass transistor 17 is disabled, the pass terminal of pass transistor 19 is turned on, and a logical zero signal appears at the output terminal of the switch S. This arrangement prevents appearance of a floating or indefinite voltage state at the output terminal of the pass transistor 17 when this pass transistor is turned off, and provides the proper input signal of D or logical zero for the OR gate. If transistors 17 and 19 are both n-channel type, the output signal of the switch S is $OS = C \cdot D + C^* \cdot O$. If the transistors 17 and 19 are both p-channel type, the output of the switch S is $OS = C^* \cdot D + C \cdot O$.

If the two pass transistors are of different channel types, as illustrated in FIG. 3, the inverter 23 that is used to invert the control signal C that is delivered to the pass terminal for the second pass transistor 19, may be eliminated. This is illustrated in FIG. 3, in which one pass transistor 17 is of n-channel type and the other pass transistor 19 is of p-channel type. Alternatively, the pass transistors 17 and 19 may be of p-channel type and n-channel type, respectively, with no change required in the configuration shown in FIG. 3. If transistors 17 and 19 are of n-channel type and p-channel type, respectively, the output signal of the switch S is $OS = C \cdot D + C^* \cdot O$. If transistors 17 and 19 are of p-channel type and n-channel type, respectively, the output signal of the switch S is $OS = C^* \cdot D + C \cdot O$.

FIG. 4 illustrates the use of another embodiment of the invention to produce a programmable AND gate 31, whose output signal is the logical product formed by multiplication of a selected group of input signals. The AND gate 31 has a plurality of n-input terminals and an output terminal. A plurality of switches T1, T2, ..., Tn are positioned adjacent to the AND gate input terminals, and switch number Tk (k=1, 2, ..., n) receives a data input signal Dk at an input terminal, receives a control signal Ck at a control input terminal, and issues an output signal at an output terminal that is either the input signal Dk or a logical one signal depending on the control signal received. Each control signal Ck is independently programmable.

FIG. 5 illustrates one embodiment of a switch T that may be used in the AND gate configuration shown in FIG. 4. A first pass transistor 37 and a second pass transistor 39 are connected at their output terminals, which are connected to an input terminal of the AND gate. The pass terminal of the first pass transistor 37 receives a control signal C from a control signal source 41, and this control signal is inverted by an inverter 43 and the inverted signal C* is delivered to the pass terminal of the second pass transistor 39. The input terminal of the first pass transistor 37 receives a data input signal D, and the input terminal of the second pass transistor 39 is tied to a relatively high voltage source 45 that delivers a logical one signal thereat. In the embodiment shown in FIG. 5, it is assumed that the two pass transistors 37 and 39 have the same channel type, namely both n-channel type or both p-channel type. If the control signal C that is delivered to the pass terminal of pass transistor 37 is in a predetermined first state, for example, a relatively high voltage corresponding to a logical one signal, pass transistor 37 will pass the input signal D from its input terminal to its output terminal in a well known manner. In this instance, the control signal C* that is delivered to the pass terminal of the second pass transistor 39 will turn off pass transistor 39 and block the passage of the logical one signal. The result of this is that the input terminal that is connected to the output terminal of pass transistors 37 and 39 receives the input signal D. If the control signal C is in a predetermined second state, pass transistor 37 will block the input signal D, pass transistor 39 will pass the logical one signal to its output terminal, and the logical one signal will be received by the input terminal of the AND gate that is connected to the output terminals of the first and second pass transistors. When the pass transistors 37 and 39 are connected in this manner, the output terminal of each of these pass transistors always manifests to a definite voltage and does not float. If transistors 37 and 39 are both n-channel type, the output signal of the switch T is $OT = C \cdot D + C^* \cdot 1$. If transistors 37 and 39 are both p-channel type, the output signal of the switch T is $OT = C^* \cdot D + C \cdot 1$.

FIG. 6 illustrates an embodiment of the invention wherein the pass transistors 37 and 39 have opposite channel types. Here, the same control signal C can be delivered to the pass terminals of both transistors, and the inverter 43 shown in FIG. 5 can be deleted. If transistors 37 and 39 are of n-channel type and p-channel type, respectively, the output signal of the switch T is $OT = C \cdot D + C^* \cdot 1$. Alternatively, the pass transistors 37 and 39 may be of p-channel type and n-channel type, respectively, with no change required in the configuration shown in FIG. 6. If transistors 37 and 39 are of p-channel type and n-channel type, respectively, the output signal of the switch T is $OT = C^* \cdot D + C \cdot 1$.

In FIG. 1, each of the input controls Sk (k=1, 2, ..., n) is shown to be a programmable switch. As an alternative, a subset of the input controls Sk could be provided as programmable switches for the OR gate 11. The remainder of the input controls Sk could be non-programmable terminals, reflecting the possibility that some of the input signals may always appear in a logical equation, whether or not other input signals are incorporated therein. In a similar manner, some of the input controls Tk (k=1, 2, ..., n) shown in FIG. 4 may be programmable switches and the remainder may be non-programmable input terminals. Similarly, some of the input controls Sk (k=1, 2, ..., n) shown in FIG. 8 may be programmable switches and the remainder may be nonprogrammable input terminals.

FIG. 7 illustrates one use of programmable AND gates and programmable OR gates in the AND plane and OR plane of a programmable logic device. Multiple AND gates are shown, each represented in a manner well known in the art by a both signal, e.g. 26A, and a symbol, e.g. 27A, which together form the AND. The inputs for the AND are selected from among the signals and their inverses on lines 24-1, 24-2, 24-3, 24-4, 24-5 and 24-6 by programmable connections such as PC1. In this embodiment, some or all of the AND gates can be implemented by means of the programmable AND gates as shown in FIG. 4 instead of the WIRED-AND gates well known in the art. The programmable connections PC1 may be fuses, anti-fuses, EPROMs or EEPROMs or may be controlled by ROMs, RAMs, shift registers or other registers.

Each of the AND gates, such as the combination 6A and 27A, is programmable to admit a chosen subset of the input signals and to issue the logical product of this subset of signals as an output signal on one of the output lines 28A, 28B and 28C respectively. Other AND gates, such as the combination 26D and 27D, or 26E and 27E, which may be programmable or non-programmable, issue their output signals on one of the output lines 28D and 28E, respectively. The output signals carried on the output lines 28A, 28B, ..., 28E are selectively connectable to OR gates 29A and 30A, 29B and 30B, 29C and 30C, 29D and 30D, 29E and 30E, and 29F and 30F through programmable connections such as PC2 that are well known in the art and which form OR gates represented by the symbols 30A to 30F. Alternatively, the programmable connections PC2 may be the control inputs to programmable OR gates as shown in FIG. 1 and the OR gate is implemented as shown in FIG. 1. The programmable connections PC2 may be fuses, anti-fuses, EPROMs or EEPROMs or may be controlled by ROMs, RAMs, shift registers or other registers. The output signals from the programmable AND gates 26A and 27A, ..., 26E and 27E are selectively collected as new assemblies of signals and are fed to a plurality of programmable OR gates 29A and 30A, ..., 29F and 30F. Each of these OR gates is programmable to admit a chosen subset of the input signals and to issue the logical sum of this subset of signals as an output signal. Alternatively, some or all of the AND gates shown in FIG. 7 may be non-programmable and the OR gates may be programmable. As a second alternative, some or all of the OR gates shown in FIG. 7 may be non-programmable and the AND gates may be programmable. The programmable AND and OR gates of the invention may be substituted for one, several or all non-programmable gates in the array shown in FIG. 7. The programmable connections PC1 or the programmable connections PC2 may be replaced by nonprogrammable connections in FIG. 7.

The control signal sources 21 in FIGS. 2 and 3 and 41 in FIGS. 5 and 6 may be fuses (active until rendered inactive), anti-fuses (inactive until rendered active), EPROMs or EEPROMs or the control signals may be entered from or through a RAM, a ROM, a shift register or any other register. Except for the fuse and the anti-fuse control signals, these control signals can be reconfigured to represent new logical equations.

Either of the switch embodiments shown in FIGS. 2 or 3 may be used to provide a programmable EXCLUSIVE-OR ("XOR") gate as illustrated in FIG. 8. The XOR gate 51 has n input terminals and one output terminal, and input terminal number j (j=1, 2, ..., n) is connected to the output terminal of a programmable switch Sj that has a data input terminal and a control input terminal as above. The data input terminal of switch Sj receives an input signal A; and input terminal number j of the XOR gate 51 receives either the signal Aj or a logical zero signal depending on the control signal Cj received at the control input terminal of switch Sj. Formation of the EXCLUSIVE-OR product of two or more logical variables is associative and commutative and satisfies the relations $(A \oplus B) \oplus C = A \oplus (B \oplus C)$, $A \oplus b = B \oplus A$, $A \oplus 1 = A$, $A \oplus 1 = A^*$ (logical complement of A).

Thus, if a logical zero signal is provided at an input terminal of the XOR gate 51, this is equivalent to deleting that input to the XOR gate; and the output signal from the XOR gate will only depend on the input signals that are not identically zero.

The programmable OR gates, AND gates and XOR gates discussed above may be used in a programmable logic device in which output signals from an array of AND gates are programmably or non-programmably connected to input terminals for an array of OR gates to produce a sequence of desired output signals. FIG. 9 illustrates an example of such a use in a PLD, using three input signals per gate for definiteness. A switchable AND gate 61 receives three input signals A0, A1 and A2 at three input terminals and receives three control signals C1, C2 and C3 at the AND gate 61 as well. The three control signals C1, C2 and C3 determine which of the input signals received on line A0, A1 and A2, respectively, will be actively processed by the AND gate 61, as discussed above in connection with FIGS. 4, 5 and 6. Similarly, AND gate 63 receives input signals A3, A4 and A5 and receives corresponding control signals C4, C5 and C6; and switchable AND gate 65 receives input signals A6, A7 and A8 and receives corresponding control signals C7, C8 and C9. The number of signals received by each switchable AND gate 61, 63 and 65 need not be the same. The output terminals of the switchable AND gates 61, 63 and 65 produce output signals 061, 063 and 065 on their respective output lines. These three output lines are connected to three lines, respectively, that are connected to the input terminals of a switchable OR gate 67. The switchable OR gate 67 also receives three control signals C10, C11 and C12 that determine which of the input line signals will be actively processed by the switchable OR gate 67. The output signals from the AND gates 61, 63 and 65 and the OR gate 67 become $061 = (C1 \cdot A0 + C1^*) \cdot (C2 \cdot A1 + C2^*) \cdot (C3 \cdot A2 + C3^*)$,
$063 = (C4 \cdot A3 + C4^*) \cdot (C5 \cdot A4 + C5^*) \cdot (C6 \cdot A5 + C6^*)$,
$065 = (C7 \cdot A6 + C7^*) \cdot (C8 \cdot A7 + C8^*) \cdot (C9 \cdot A8 + C9^*)$,
$067 = C10 \cdot 061 + C11 \cdot 063 + C12 \cdot 065$.

The switchable OR gate 67 issues an output signal on the line 067 that may be subjected to further processing, may be fed back to an earlier point in the flow of data being processed, or may be fed to a macrocell for possible output of this signal at an output pin for the system. The arrangement shown in FIG. 9 is an example, used for purposes of illustration only. The switchable AND gates and switchable OR gates shown in FIG. 9 could be exchanged, or one or both of these sets could be replaced by switchable XOR gates for purposes of signal processing.

FIG. 10 illustrates another embodiment of the basic environment shown in FIG. 9. In FIG. 10, each of three switchable AND gates 71, 73 and 75 receives the same three input signals A0, A1 and A2. Additionally, the gate 71 receives a fourth input signal A3, the gate 73 receives a fourth input signal A4, and the gate 75 receives a fourth input signal A5. Each of the three AND gates 71, 73 and 75 is independently controlled by four control signals Ci (i=1, 2, ..., 12), one for each of the four input signals at that gate, so that the output signals therefrom are not necessarily related. The three output signals 071, 073 and 075 from the three AND gates 71, 73 and 75 are hardwired to three input terminals of a switchable OR gate 77, as shown, with the input signals being controlled by three control signals C13, C14 and C15. As a result, the output signals from the AND gates 71, 73 and 75 and the OR gate 77 become $071 = (C1 \cdot A0 + C1^*) \cdot (C2 \cdot A1 + C2^*) \cdot (C3 \cdot A2 + C3^*) \cdot (C4 \cdot A3 + C4^*)$,
$073 = (C5 \cdot A0 + C5^*) \cdot (C6 \cdot A1 + C6^*) \cdot (C7 \cdot A2 + C7^*) \cdot (C8 \cdot A4 + C8^*)$,
$075 = (C9 \cdot A0 + C9^*) \cdot (C10 \cdot A1 + C10^*) \cdot (C11 \cdot A2 + C11^* \cdot 1) \cdot (C12 \cdot A5 + C12^*)$,
$077 = C13 \cdot 071 + C14 \cdot 073 + C15 \cdot 075$.

It is often desirable to provide as few programmable fuses or switches as possible, consistent with the range of signal processing to be performed. This is because each programmable fuse or switch that is added to a given line increases the capacitance loading of that line and thereby increases the associated time delay for processing of a signal that proceeds along that line. Provision of an array of programmable AND gates, OR gates or XOR gates may ease the constraint on the number of programmable fuses or switches connecting the output lines from one set of logic gates to the input lines of another set of logic gates, by allowing some or all of the burden of these programmable connections to be carried by the programmable logic gates themselves.

I claim:

1. A programmable logic gate that may be programmed to accept all or a selected subset of input signals for signal summation, the gate coprising:
    (a) signal summation means having a plurality of input terminals and an output terminal, for receiving a data input signal or a logical zero input signal at each input terminal and for forming the logical sum of the data input signals and the logical zero signals and for issuing this sum as an output signal at the output terminal; and
    (b) a plurality of individually programmable switches, each programmable switch having a data input terminal, a control input terminal and an output terminal, with each output terminal being connected to one of the input terminals of the summation means, each data input terminal receiving a data input signal, and each control input terminal receiving a control signal that has a first state and a second state, where receipt of a control signal in the first state causes the output terminal of that switch to issue the data input signal and receipt of a control signal in the second state causes the output terminal of that switch to issue a logical zero signal, wherein each said programmable switch comprises:

(1) a first pass transistor of a channel type having an input terminal, a pass terminal and an output terminal, the transistor receiving said data input signal at its input terminal, receiving said control signal at its pass terminal, and having its output terminal connected to one of said input terminals of said summation means; and (2) a second pass transistor that has the same channel type and the same terminals as the first pass transistor, having its input terminal connected to a logical zero signal, receiving the logical complement of said control signal at its pass terminal, and having its output terminal connected to the output terminal of the first pass transistor.

2. The gate of claim 1, further including a plurality of control signal sources, with each control signal source being connected to a single corresponding control input terminal of said programmable switches, to supply said control signal for said programmable switch.

3. The gate of claim 2, wherein said control signal source is drawn from a class of sources having two signal values and consisting of fuses, anti-fuses, EPROMs, EEPROMs, RAMs, ROMs, shift registers and registers.

4. A programmable logic gate that may be programmed to accept all or a selected subset of input signals for signal summation, the gate comprising:
    (a) signal summation means having a plurality of input terminals and an output terminal, for receiving a data input signal or a logical zero input signal at each input terminal and for forming the logical sum of the data input signals and the logical zero signals and for issuing this sum as an output signal at the output terminal; and
    (b) a plurality of individually programmable switches, each programmable switch having a data input terminal, a control input terminal and an output terminal, with each output terminal being connected to one of the input terminals of the summation means, each data input terminal receiving a data input signal, and each control input terminal receiving a control signal that has a first state and a second state, where receipt of a control signal in the first state causes the output terminal of that switch to issue the data input signal and receipt of a control signal in the second state causes the output terminal of that switch to issue a logical zero signal, wherein each said programmable switch comprises:
(1) a first pass transistor of a first channel type having an input terminal, a pass terminal and an output terminal, said transistor receiving said data input signal at its input terminal, receiving said control signal at its pass terminal, and having its output terminal connected to one of said input terminals of said summation means; and
(2) a second pass transistor of a second channel type that is opposite to the first channel type and that has the same terminals as the first pass transistor, having its input terminal connected to a logical zero signal, receiving said control signal at its pass terminal, and having its output terminal connected to the output terminal of the first pass transistor.

5. The gate of claim 4, further including a plurality of control signal sources, with each control signal source being connected to a signal corresponding control input terminal of said programmable switches, to supply said control signal for said programmable switch.

6. The gate of claim 5, wherein said control signal source is drawn from a class of sources having two signal values and consisting of fuses, anti-fuses, EPROMs, EEPROMs, RAMs, ROMs, shift registers and registers.

7. A programmable logic gate that may be programmed to accept all or a selected subset of input signals for signal summation, the gate comprising:
(a) signal summation means having a plurality of input terminals and an output terminal, for receiving a data input signal or a logical zero input signal at each input terminal and for forming the logical sum of the data input signals and the logical zero signals and for issuing this sum as an output signal at the output terminal, said signal summation means further including at least one non-programmable input terminal that accepts an input signal irrespective of the state of control signals received at a plurality of programmable switches; and
(b) a plurality of individually programmable switches, each programmable switch having a data input terminal, a control input terminal and an output terminal, with each output terminal being connected to one of the input terminals of the summation means, each data input terminal receiving a data input signal, and each control input terminal receiving a control signal that has a first state and a second state, where receipt of a control signal in the first state causes the output terminal of that switch to issue the data input signal and receipt of a control signal in the second state causes the output terminal of that switch to issue a logical zero signal.

8. The gate of claim 7, further including a plurality of control signal sources, with each control signal source being connected to a single corresponding control input terminal of said programmable switches, to supply said control signal for said programmable switch.

9. The gate of claim 8, wherein said control signal source is drawn from a class of sources having two signal values and consisting of fuses, anti-fuses, EPROMs, EEPROMs, RAMs, ROMs, shift registers and registers.

10. A programmable logic gate that may be programmed to accept all or a selected subset of input signals for signal multiplication, the gate comprising:
(a) signal multiplication means having a plurality of input terminals and an output terminal, for receiving a data input signal or a logical one input signal at each input terminal and for forming the logical one product of the data input signals and the logical one signals and for issuing this product as an output signal at the output terminal; and
(b) a plurality of individually programmable switches, each switch having a data input terminal, a control input terminal and an output terminal, with each output terminal being connected to one of the input terminals of the multiplication means, each data input terminal receiving a data input signal and each control input terminal receiving a control signal that has a first state and a second state, where receipt of a control signal in the first state causes the output terminal of that switch to issue the data input signal and receipt of a control signal in the second state causes the output terminal of that switch to issue a logical one signal, wherein each said programmable switch comprises:
(1) a first pass transistor of a first channel type having an input terminal, a pass terminal and an output terminal, said transistor receiving said data input signal at its input terminal, receiving said control signal at its pass terminal, and having its output terminal connected to one of said input terminals of said multiplication means; and
(2) a second pass transistor that has the same channel type and the same terminals as the first pass transistors, having its input terminal connected to a logical one signal, receiving the logical complement of said control signal at its pass terminal, and having its output terminal connected to the output terminal of the first pass transistor.

11. The gate of claim 10, further including a plurality of control signal sources, with each control signal source being connected to a single corresponding control input terminal of said programmable switches, to supply said control signal for said programmable switch.

12. The gate of claim 11, wherein said control signal source is drawn from a class of sources having two signal values and consisting of fuses, anti-fuses, EPROMs, EPROMs, RAMs, ROMs, shift registers and registers.

13. A programmable logic gate that may be programmed to accept all or a selected subset of input signals for signal multiplication, the gate comprising:
(a) signal multiplication means having a plurality of input terminals and an output terminal, for receiving a data input signal or a logical one input signal at each input terminal and for forming the logical product of the data input signals and the logical one signals and for issuing this product as an output signal at the output terminal; and
(b) a plurality of individually programmable switches, each switch having a data input terminal, a control input terminal and an output terminal, with each output terminal connected to one of the input terminals of the multiplication means, each data input terminal receiving a data input signal and each control input terminal receiving a control signal that has a first state and a second state, where receipt of a control signal in the first state causes the output terminal of that switch to issue the data input signal and receipt of a control signal in the second state causes the output terminal of that switch to issue a logical one signal, wherein each said programmable switch comprises:

(1) a first pass transistor of a first channel type having an input terminal, a pass terminal and an output terminal, said transistor receiving said data input signal at its input terminal, receiving said control signal at its pass terminal, and having its output terminal connected to one of said input terminals of said multiplication means; and (2) a second pass transistor of a second channel type that is opposite to the first channel type and that has the same terminals as the first pass transistor, having its input terminal connected to a logical one signal, receiving said control signal at its pass terminal, and having its output terminal connected to the output terminal of the first pass transistor.

14. The gate of claim 13, further including a plurality of control signal sources, with each control signal source being connected to a single corresponding control input terminal of said programmable switches, to supply said control signal for said programmable switch.

15. The gate of claim 14, wherein said control signal source is drawn from a class of sources having two signal values and consisting of fuses, anti-fuses, EPROMs, EEPROMs, RAMs, ROMs, shift registers and registers.

16. A programmable logic gate that may be programmed to accept all or a selected subset of input signals for signal multiplication, the gate comprising:

(a) signal multiplication means having a plurality of input terminals and an output terminal, for receiving a data input signal or a logical one input signal at each input terminal and for forming the logical product of the data input signals and the logical one signals and for issuing this product as an output signal at the output terminal, said signal multiplication means further including at least one non-programmable input terminal that accepts an input signal irrespective of the state of control signals received at a plurality of programmable switches; and (b) a plurality of individually programmable switches, each switch having a data input terminal, a control input terminal and an output terminal, with each output terminal connected to one of the input terminals of the multiplication means, each data input terminal receiving a data input signal, and each control input terminal receiving a control signal that has a first state and a second state, where receipt of a control signal in the first state causes the output terminal of that switch to issue the data input signal and receipt of a control signal in the second state causes the output terminal of that switch to issue a logical one signal.

17. The gate of claim 16, further including a plurality of control signal sources, with each control signal source being connected to a single corresponding control input terminal of said programmable switches, to supply said control signal for said programmable switch.

18. The gate of claim 17, wherein said control signal source is drawn from a class of sources having two signal values and consisting of fuses, anti-fuses, EPROMs, EEPROMs, RAMs, ROMs, shift registers and registers.

19. A programmable logic device comprising:

EXCLUSIVE-OR logic means having at least one logic gate for forming the EXCLUSIVE-OR function of a set of signals; and means for programming the logic gate for accepting all or a selected subset of input signals, the EXCLUSIVE-OR logic means having input line means for receiving the input signals.

20. A programmable logic gate that may be programmed to accept all or a selected subset of input signals for signal summation, the gate comprising:

EXCLUSIVE-OR signal formation means having a plurality of input terminals and an output terminal, for receiving a data input signal or a logical zero input signal at each input terminal and for forming the EXCLUSIVE-OR signal from the input signals and for issuing this EXCLUSIVE-OR signal as an output signal at the output terminal; and a plurality of individually programmable switches, each switch having a data input terminal, a control input terminal and an output terminal, with each output terminal being connected to one of the input terminals of the EXCLUSIVE-OR signal formation means, each data input terminal receiving a data input signal, and each control input terminal receiving a control signal that has a first state and a second state, where receipt of a control signal in the first state causes the output terminal of that switch to issue the data input signal and receipt of a control signal in the second state causes the output terminal of that switch to issue a logical zero signal.

21. The gate of claim 20, wherein said programmable switch comprises:

a first pass transistor of a first channel type having an input terminal, a pass terminal and an output terminal, the transistor receiving said data input signal at its input terminal, receiving said control signal at its pass terminal, and having its output terminal connected to one of said input terminals of said summation means; and a second pass transistor that has the same channel type and terminals as the first pass transistor, having its input terminal connected to a logical zero signal, receiving the logical complement of said control signal at its pass terminal, and having its output terminal connected to the output terminal of the first pass transistor.

22. The gate of claim 20, wherein said programmable switch comprises:

a first pass transistor of a first channel type having an input terminal, a pass terminal and an output terminal, the transistor receiving said data input signal at its input terminal, receiving said control terminal at its pass terminal, and having its output terminal connected to one of said input terminals of said summation means; and a second pass transistor of a second channel type that is opposite to the first channel type and that has the same terminals as the first pass transistor, having its input terminal connected to a logical zero signal, receiving said control signal at its pass terminal, and having its output terminal connected to the output terminal of the first pass transistor.

23. The gate of claim 20, wherein said EXCLUSIVE-OR signal formation means further includes at least one non-programmable input terminal that accepts an input signal irrespective of the state of said control signals received at said plurality of programmable switches.

24. The gate of claim 20, further including a plurality of control signal sources, with each control signal source being connected to a single corresponding control input terminal of said programmable switches, to supply said control signal for said programmable switch.

25. The gate of claim 24, wherein said control signal source is drawn from a class of sources having two signal values and consisting of fuses, anti-fuses, EPROMs, EEPROMs, RAMs, ROMs, shift registers and registers.

26. A programmable logic array comprising:
a first programmable AND gate having m input terminals to receive m input signals $A_i$ numbered $i=1, 2, \ldots, m$ thereat, having m control input terminals to receive m control input signals $C_i$ numbered $i=1, 2, \ldots m$ where m is a positive integer, and having an output terminal that issues a logical product output signal $O1=(C1 \cdot A1+C1^*) \cdot (C2 \cdot A2+C2^*) \ldots (Cm \cdot Am+Cm^*)$, wherein at least two of said input signals $A_i$ are the same;
a second programmable AND gate having n input terminals to receive n input signals $B_j$ numbered $j=1, 2, \ldots, n$ thereat, having n control input terminals to receive n control input signals $D_j$ numbered $j=1, 2, \ldots, n$, where n is a positive integer, and having an output terminal that issues a logical product output signal $O2=(D1 \cdot B1+D1^*) \cdot (D2 \cdot B2+D2^*) \ldots (Dn \cdot Bn+Dn^*)$; and
a programmable OR gate having at least first and second input terminals to receive the signals O1 and O2, having at least two control input terminals to receive control input signals E1 and E2, and having an output terminal that issues a logical sum output signal $O3=E1 \cdot O1+E2 \cdot O2$.

27. A programmable logic array comprising:
a first programmable AND gate having m input terminals to receive m input signals $A_i$ numbered $i=1, 2, \ldots, m$ thereat, having m control input terminals to receive m control input signals $C_i$ numbered $i=1, 2, \ldots m$ where m is a positive integer, and having an output terminal that issues a logical product output signal $O1=(C1 \cdot A1+C1^*) \cdot (C2 \cdot A2+C2^*) \ldots (Cm \cdot Am+Cm^*)$, wherein at least two of said input signals $A_i$ are the same;
a second programmable AND gate having n input terminals to receive n input signals $B_j$ numbered $j=1, 2, \ldots, n$ thereat, having n control input terminals to receive n control input signals $D_j$ numbered $j=1, 2, \ldots, n$, where n is a positive integer, and having an output terminal that issues a logical product output signal $O2=(D1 \cdot B1+D1^*) \cdot (D2 \cdot B2+D2^*) \ldots (Dn \cdot Bn+Dn^*)$; and
an OR gate having at least first and second input terminals to receive the signals O1 and O2, and having an output terminal that issues a logical sum output signal $O3=O1+O2$.

* * * * *

UNITED STATES PATENT AND TRADEMARK OFFICE
CERTIFICATE OF CORRECTION

PATENT NO. : 5,012,135

DATED : April 30, 1991

INVENTOR(S) : Cecil H. Kaplinsky

It is certified that error appears in the above-identified patent and that said Letters Patent is hereby corrected as shown below:

Column 5, line 52, "combination 6A" should read -- combination 26A --.

Column 6, line 39, "input signal A;" should read -- input signal Aj, --.

Column 6, line 47, "A⊕b" should read -- A⊕B --.

Column 6, line 48, "A⊕1=A," should read -- A⊕0=A, --.

Column 7, lines 51-56, the equations
  O71=(C1·A0+C1*)·(C2·A1+C2*)·(C-
     3·A2+C3*)·(C4·A3+C4*),
  O73=(C5·A0+C5*)·(C6·A1+C6*)·(C-
     7·A2+C7*)·(C8·A4+C8*),
  O75=(C9·A0+C9*)·(C10·A1+C10*)·(C1-
     1·A2+C11*·1)·(C12·A5+C12*),
should read
  O71=(C1·A0+C1*)·(C2·A1+C2*)·
     (C3·A2+C3*)·(C4·A3+C4*),
  O73=(C5·A0+C5*)·(C6·A1+C6*)·
     (C7·A2+C7*)·(C8·A4+C8*),
  O75=(C9·A0+C9*)·(C10·A1+C10*)·
     (C11·A2+C11*·1)·(C12·A5+C12*), Claim 1, column 8, line 7, "coprising" should read -- comprising --.

Claim 5, column 9, line 27, "signal" should read -- single --.

UNITED STATES PATENT AND TRADEMARK OFFICE
CERTIFICATE OF CORRECTION

PATENT NO. : 5,012,135

DATED : April 30, 1991

INVENTOR(S) : Cecil H. Kaplinsky

It is certified that error appears in the above-identified patent and that said Letters Patent is hereby corrected as shown below:

Claim 10, column 10, line 13, "one product" should read - -product- -; line 32, "said transistor" should read - -the transistor- -; lines 38-39, "first pass transistors" should read - -first pass transistor- -.

Claim 11, column 11, line 13, "said transistor" should read - -the transistor- -.

Claim 26, column 13, lines 27-28,
  "product output signal $01=(C1 \cdot A1+C1*) \cdot (C2 \cdot A2+C2*) \ldots (Cm \cdot Am+Cm*)$, wherein at least"
should read
  - -product output signal $01=(C1 \cdot A1+C1*) \cdot (C2 \cdot A2+C2*) \ldots (Cm \cdot Am+Cm*)$, wherein at least- -

Claim 27, column 14, lines 18-19,
  "product output signal $01=(C1 \cdot A1+C1*) \cdot (C2 \cdot A2+C2*) \ldots (Cm \cdot Am+Cm*)$, wherein at least"
should read
  - -product output signal $01=(C1 \cdot A1+C1*) \cdot (C2 \cdot A2+C2*) \ldots (Cm \cdot Am+Cm*)$, wherein at least- -

Signed and Sealed this

Fifteenth Day of December, 1992

*Attest:*

DOUGLAS B. COMER

*Attesting Officer*     *Acting Commissioner of Patents and Trademarks*